United States Patent [19]

Gray et al.

[11] Patent Number: 4,567,591
[45] Date of Patent: Jan. 28, 1986

[54] DIGITAL AUDIO SATELLITE TRANSMISSION SYSTEM

[76] Inventors: James S. Gray, 4718 Pine Acres Ct., Dunwoody, Ga. 30338; James W. Chamberlin, 368 Omega Dr.; Alan L. McBride, 2974 Moore Ave., both of, Lawrenceville, Ga. 30245; Peter G. Schreiner, III, 1281 Brockett Rd., Apartment 23D, Clarkston, Ga. 30021

[21] Appl. No.: 519,268

[22] Filed: Aug. 1, 1983

[51] Int. Cl.$^4$ ............................................. H04J 3/00
[52] U.S. Cl. ..................................... 370/109; 371/43
[58] Field of Search ................. 370/109, 104; 375/122; 371/43, 44, 45

[56] References Cited

U.S. PATENT DOCUMENTS

| 4,208,739 | 6/1980 | Lu et al. | 371/43 |
| 4,211,996 | 7/1980 | Nakamura | 371/43 |

OTHER PUBLICATIONS

IEEE Transactions on Communication Technology; vol. COM-19, No. 5, "A High-Speed Sequential Decoder: Prototype Design and Test"; Forney, Jr. et al., Oct. 1971, pp. 821-835.
IBM Journal of Research and Development; "Error Correcting Cones for Satellite Communication Channels"; Chen et al; Mar. 1976; pp. 168-175.
A. L. McBride, "Scientific-Atlanta's 3-Meter Digital Audio Terminal", (7 pages).
Satellite Communications Division, Scientific-Atlanta, Inc., "Proposal For Digital Audio Satellite Distribution for Network Radio 55TPO22A".
Scientific-Atlanta, Inc., "Satellite Distributed Digital Audio for Network Radio".
Brochure—"Digital Audio 3-Meter Earth Station", (2 pages).

Primary Examiner—Douglas W. Olms
Assistant Examiner—Frank M. Scutch, III
Attorney, Agent, or Firm—Kilpatrick & Cody

[57] ABSTRACT

A digital audio satellite transmission system involving analog-to-digital conversion of audio signals, processing of such signals and transmission to and reception from a satellite transponder link. The digitized audio signal is digitally compressed to reduce the data rate. Several such signals are then time division multiplexed together. Differential encoding, bit interleaving and forward error correction coding is utilized to maintain high signal quality, together with binary phase shift key carrier modulation. Matched filter reception of the BPSK signal transmitted over a conventional satellite transponder link is provided together with BPSK demodulation, TDM demultiplexing, differential decoding, bit deinterleaving and threshold FEC decoding. The compressed digital signal is then expanded and converted to an analog audio signal.

15 Claims, 14 Drawing Figures

Source Encoding, Channel Block Diagram

Source Encoding, Channel Block Diagram

15-BIT LINEAR PCM COMPRESSED TO 11-BIT CODE
SINE WAVE SIGNAL TO QUANTIZATION NOISE

15-BIT LINEAR TO 11-BIT COMPRESSED CODE

| 15-bit linear code | | | | | | | | | | | | | | | 11-bit compressed code | | | | | | | | | | | |
|---|---|---|---|---|---|---|---|---|---|---|---|---|---|---|---|---|---|---|---|---|---|---|---|---|---|---|
| 1 | 2 | 3 | 4 | 5 | 6 | 7 | 8 | 9 | 10 | 11 | 12 | 13 | 14 | 15 | | 1 | 2 | 3 | 4 | 5 | 6 | 7 | 8 | 9 | 10 | 11 |
| 1 | a | b | c | d | e | f | g | x | x | x | x | x | x | x | | 1 | 0 | 0 | 0 | a | b | c | d | e | f | g |
| 1 | 0 | a | b | c | d | e | f | g | x | x | x | x | x | x | | 1 | 0 | 0 | 1 | a | b | c | d | e | f | g |
| 1 | 0 | 0 | a | b | c | d | e | f | g | x | x | x | x | x | | 1 | 0 | 1 | 0 | a | b | c | d | e | f | g |
| 1 | 0 | 0 | 0 | a | b | c | d | e | f | g | x | x | x | x | | 1 | 0 | 1 | 1 | a | b | c | d | e | f | g |
| 1 | 0 | 0 | 0 | 0 | a | b | c | d | e | f | g | x | x | x | | 1 | 1 | 0 | 0 | a | b | c | d | e | f | g |
| 1 | 0 | 0 | 0 | 0 | 0 | a | b | c | d | e | f | g | x | x | | 1 | 1 | 0 | 1 | a | b | c | d | e | f | g |
| 1 | 0 | 0 | 0 | 0 | 0 | 0 | a | b | c | d | e | f | g | x | | 1 | 1 | 1 | 0 | a | b | c | d | e | f | g |
| 1 | 0 | 0 | 0 | 0 | 0 | 0 | 0 | a | b | c | d | e | f | g | | 1 | 1 | 1 | 1 | a | b | c | d | e | f | g |

FIG. 4

FIG. 5 — TYPICAL FRAME FORMAT

| CHANNEL / SUB-CHANNEL OR SUB-FRAME | 0 | 1 | 2 | 3 | 4 | 5 | 6 | 7 | 8 | 9 | 10 | 11 | 12 | 13 | 14 | 15 | 16 | 17 | 18 | 19 | BITS PER SUB-FRAME |
|---|---|---|---|---|---|---|---|---|---|---|---|---|---|---|---|---|---|---|---|---|---|
| 0 | A | A | B-0 | B-0 | A | A | A | A | A | A | B-0 | B-0 | A | A | A | A | A | A | B-0 | C-0 | 240 |
| 1 | A | A | B-1 | B-1 | A | A | A | A | A | A | B-1 | B-1 | A | A | A | A | A | A | B-1 | C-1 | 240 |
| 2 | A | A | B-0 | B-0 | A | A | A | A | A | A | B-0 | B-0 | A | A | A | A | A | A | B-0 | C-2 | 240 |
| 3 | A | A | B-1 | B-1 | A | A | A | A | A | A | B-1 | B-1 | A | A | A | A | A | A | B-0 | C-3 | 240 |
| 4 | A | A | B-0 | B-0 | A | A | A | A | A | A | B-0 | B-0 | A | A | A | A | A | A | B-0 | C-4 | 240 |
| 5 | A | A | B-1 | B-1 | A | A | A | A | A | A | B-1 | B-1 | A | A | A | A | A | A | B-1 | C-5 | 240 |
| 6 | A | A | B-0 | B-0 | A | A | A | A | A | A | B-0 | B-0 | A | A | A | A | A | A | B-0 | C-6 | 240 |
| 7 | A | A | B-1 | B-1 | A | A | A | A | A | A | B-1 | B-1 | A | A | A | A | A | A | B-1 | C-7 | 240 |
| 8 | A | A | B-0 | B-0 | A | A | A | A | A | A | B-0 | B-0 | A | A | A | A | A | A | B-0 | D-8 | 240 |
| 9 | A | A | B-1 | B-1 | A | A | A | A | A | A | B-1 | B-1 | A | A | A | A | A | A | B-1 | D-9 | 240 |
| 10 | A | A | B-0 | B-0 | A | A | A | A | A | A | B-0 | B-0 | A | A | A | A | A | A | B-0 | D-10 | 240 |
| 11 | A | A | B-1 | B-1 | A | A | A | A | A | A | B-1 | B-1 | A | A | A | A | A | A | B-1 | SYNC | 240 |

BITS PER FRAME: 2880

A: 15 kHz audio
B-0: 7.5 kHz audio
B-1: 7.5 kHz audio
C-X: voice cue
D-X: data
SYNC: system syncronization

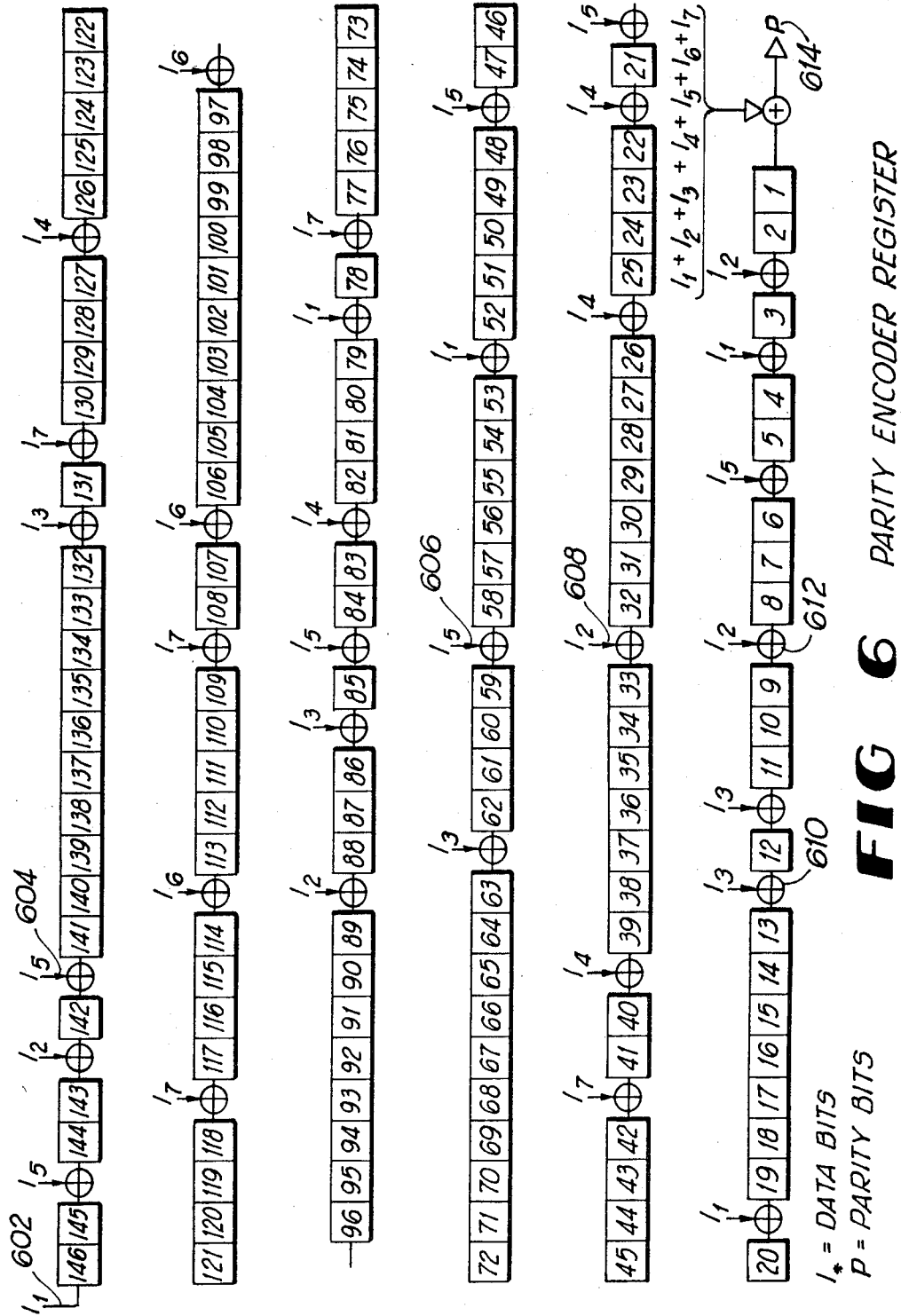
FIG. 6   PARITY ENCODER REGISTER

Source Decoding, Channel Block Diagram

Source Decoding, Channel Block Diagram

DIGITAL AUDIO SATELLITE TRANSMISSION SYSTEM

BACKGROUND OF THE INVENTION

This invention relates to analog-to-digital conversion of audio signals, transmission of such signals over an earth satellite transponder link, reception of such signals and conversion back to analog form.

Long distance transmission of high quality audio program material, as well as data and low quality audio material, has long been desirable in a number of commercial applications, including, in particular, transmission of such material by the various radio networks to their local affiliate radio stations for either immediate or later broadcast or use in connection with broadcasting activities. Such transmission has conventionally been accomplished over common carrier audio transmission channels utilizing conventional analog signal transmission equipment and techniques and conventional land lines and land based microwave transmission links.

Such conventional transmission is, however, expensive, is frequently difficult to achieve without severe degradation of signal quality and requires significant transmission bandwidth. Such constraints have, for instance, limited the quantity and quality of programming radio networks could transmit to their local affiliate stations for broadcast.

SUMMARY OF THE INVENTION

The digital audio equipment and techniques of the present invention utilize and innovatively combine several audio processing, coding, error detection, modulation and other techniques with earth satellite transmission and reception.

To realize the advantages of a digital communications channel, an audio input source must be digitally encoded. The analog processing prior to encoding and the manner in which the analog signal source is encoded into digital words determines the maximum attainable signal-to-noise ratio (S/N), the S/N at any given input level, and the minimum data rate which is required in the channel.

The objectives in determining the appropriate source encoding for the digitally implemented program audio channel of the present invention were: (1) that the coded channel must perform as well as, if not better than, a completely analog channel intended for the same purpose, and (2) that the cost of realization must be minimized.

Source encoding with a 15-bit linear pulse code modulation (PCM) digitally compressed to 11 bits was found to provide system performance better than currently used analog channels in a cost-effective manner. Digital compression allows the full dynamic range of a 15-bit linear analog-to-digital (A/D) converter to be used in encoding the source, while requiring only a 11-bit representation of the input sample to be transmitted. This reduces the bandwidth required to transmit the sampled input, thereby making more efficient use of available satellite capacity.

Generally, the present invention digitizes an audio signal and then employs digital compression techniques to reduce the data rate. It time division multiplexes together several such digitized audio channels or a combination of audio and data channels. It employs differential encoding, bit interleaving and forward error correction (FEC) coding techniques to maintain high signal quality, and then binary phase shift key (BPSK) modulates a carrier.

The BPSK signal is then conventionally upconverted to the 6 GHz transmit band, amplified and transmitted to a satellite, where the signal is received, translated in frequency to the 4 GHz receive band, and retransmitted back to earth. At the digital audio receive-only terminal of the present invention, the 4 GHz downlink signal is received, typically with a conventional 2.8 meter parabolic disk antenna and a conventional low noise amplifier. The wideband BPSK receiver of the present invention then down converts the RF signal to a conventional 70 MHz intermediate frequency.

The receive digital audio equipment of the present invention then provides matched filter reception of the time division multiplex (TDM) waveform in a BPSK demodulator and differential decoding, bit deinterleaving, and FEC threshold decoding stages. Thereafter it demultiplexes the composite signal into a 11-bit data word for program audio, which is expanded to 15 bits, plus a 9 bit address, and converts the digitized audio signals back to analog signals.

BRIEF DESCRIPTION OF THE DRAWINGS

FIG. 4 is a table showing the compressed 11-bit code assigned to positive 15-bit input words in each of the cords of the seven segment approximation to the positive half of the logarithmic companding characteristic and utilized in the digital compression step of the present invention accomplished in the digital compression, TDM multiplexer and scrambler stage 106 of FIG. 1.

FIG. 5 illustrates a typical frame format in accordance with the time division multiplexing of the present invention performed in digital compression, TDM multiplexer and scrambler stage 106 of FIG. 1.

FIG. 6 illustrates a forward error correction (FEC) parity encoder register within differential encoder, bit interleaver and FEC encoder stage 108 of FIG. 1.

DETAILED DESCRIPTION OF THE DRAWINGS

Figure 1:
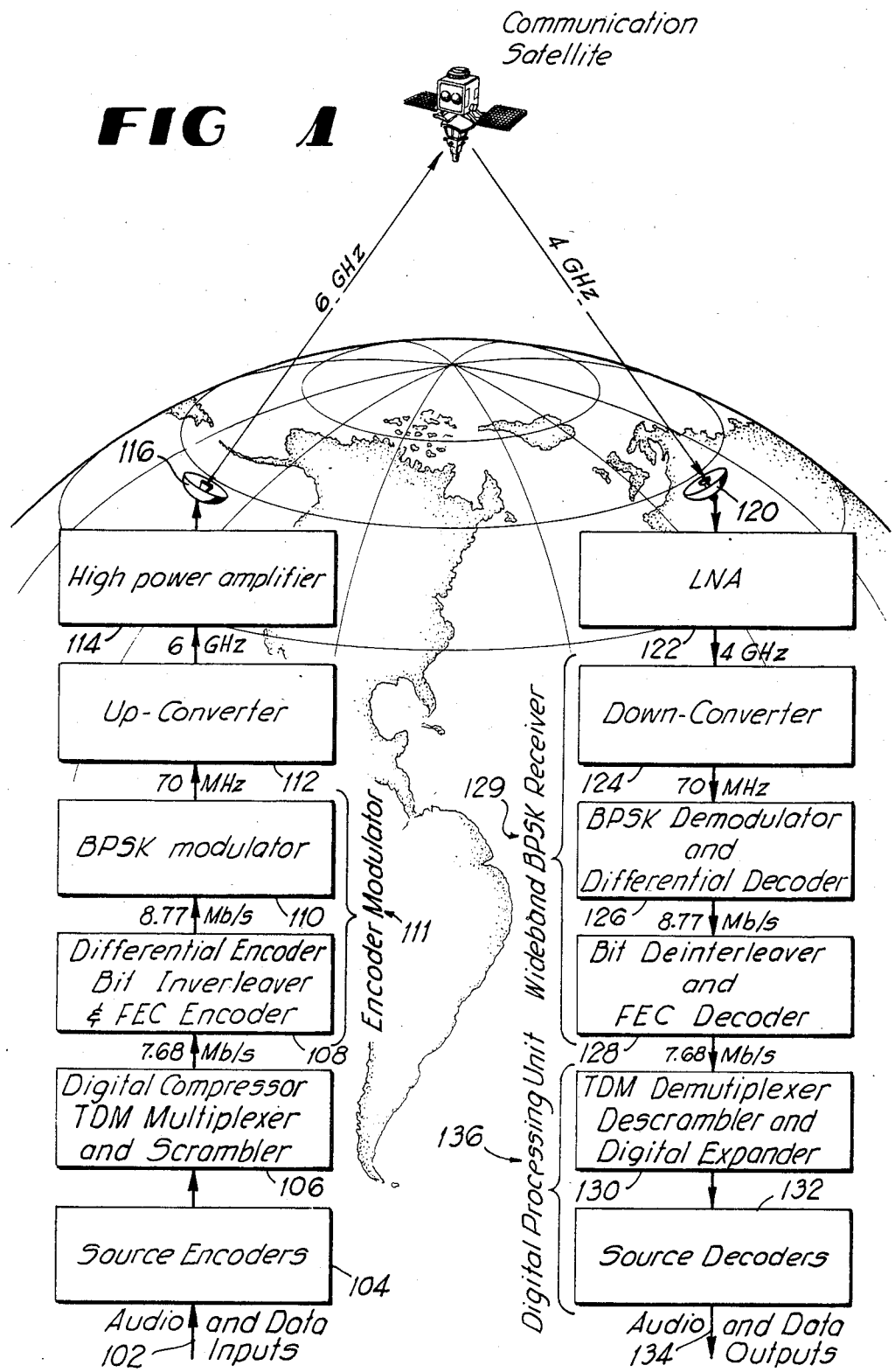
FIG. 1 is a simplified flow diagram of the preferred embodiment of the present invention.

Referring to FIG. 1, which is a simplified flow diagram of the preferred embodiment of the present invention, analog audio and data input signals 102 are applied to source encoders 104. Signals 102 may include broadcast quality analog audio program material, voice cue channels and data channels. Source encoders 104 convert the analog audio signals of input 102 to digital form. Digital compression and time division multiplexing is then accomplished in a compression, multiplexing and scrambling stage 106 to reduce the data rate and multiplex into a single data stream the several audio, voice cue and date channels digitized in the preceding source encoders 104 into a 7.68 Mb/s data stream. In the preferred embodiment this 7.68 Mb/s data stream comprises twenty 384 kb/s data streams or channels. Each 384 kb/s channel can support, for instance, either one 15 kHz bandwidth program, two 7.5 kHz bandwidth programs, twelve 32 kb/s auxiliary channels, or one 7.5 kHz bandwidth program channel and six 32 kb/s auxiliary channels.

The 32 kb/s channels may be used for auxiliary services such as voice cue and data. In the preferred embodiment, the voice cue channel utilizes 32 kb/s continuously variable slope delta (CVSD) modulation for voice processing in accordance with the teaching of James J. Spilker, Jr., *Digital Communications by Satellite* (Prentice Hall, 1977) pp. 110–112, or Motorola Semiconductor Products, Inc. MC3518 applications literature, both of which are incorporated herein by reference. The data channel may conveniently be designed to accept three asynchronous data inputs at rates from 50 b/s to 9600 b/s and combine them into a composite data stream of 32 kb/s.

The 7.68 Mb/s data stream is then processed in a stage 108, where differential encoding, bit interleaving and forward error correction (FEC) coding occur, which increases the data rate as explained below. The resulting 8.777 Mb/s data stream is then applied to a binary phase shift key (BPSK) modulator 110 utilizing a 70 MHz carrier. FEC encoder stage 108 and modulator stage 110 together form the FEC encoder-BPSK modulator 111.

The 70 MHz BPSK encoder-modulator 111 signal is then conventionally upconverted in converter 112 to the standard 6 GHz satellite transmission band, amplified in amplifier 114 and transmitted via antenna 116 to a communication satellite with transponder 118, where the signal is translated to the standard 4 GHz band and retransmitted back to earth. The signal is received by earth receiving antenna 120 and amplified in a low noise amplifier 122. It is then down converted in down converter 124 to the conventional 70 MHz intermediate frequency, and the processes of digitizing, compressing, multiplexing, differentially encoding, bit interleaving, forward error correction encoding and modulating are reversed by a binary phase shift key demodulator and differential decoder 126, a bit deinterleaver and forward error correction decoder 128, a descrambler, TDM demultiplexer and digital expander 130 and source decoders 132, thereby producing analog audio output signals 134 indistinguishable from the input signals 102 by the human ear.

Stages 124, 126 and 128 together form a wideband BPSK receiver 129, and stages 130 and 132 together function as a digital processing unit 136 which separates the data stream from receiver 129 into words which are placed on the data bus together with the address of channels to which those words are assigned.

There follows a detailed description of the design criteria of the present invention for a dual 15-KHz bandwidth channel.

a. 15-KHZ AUDIO CHANNEL SOURCE CODING

Figure 2A:
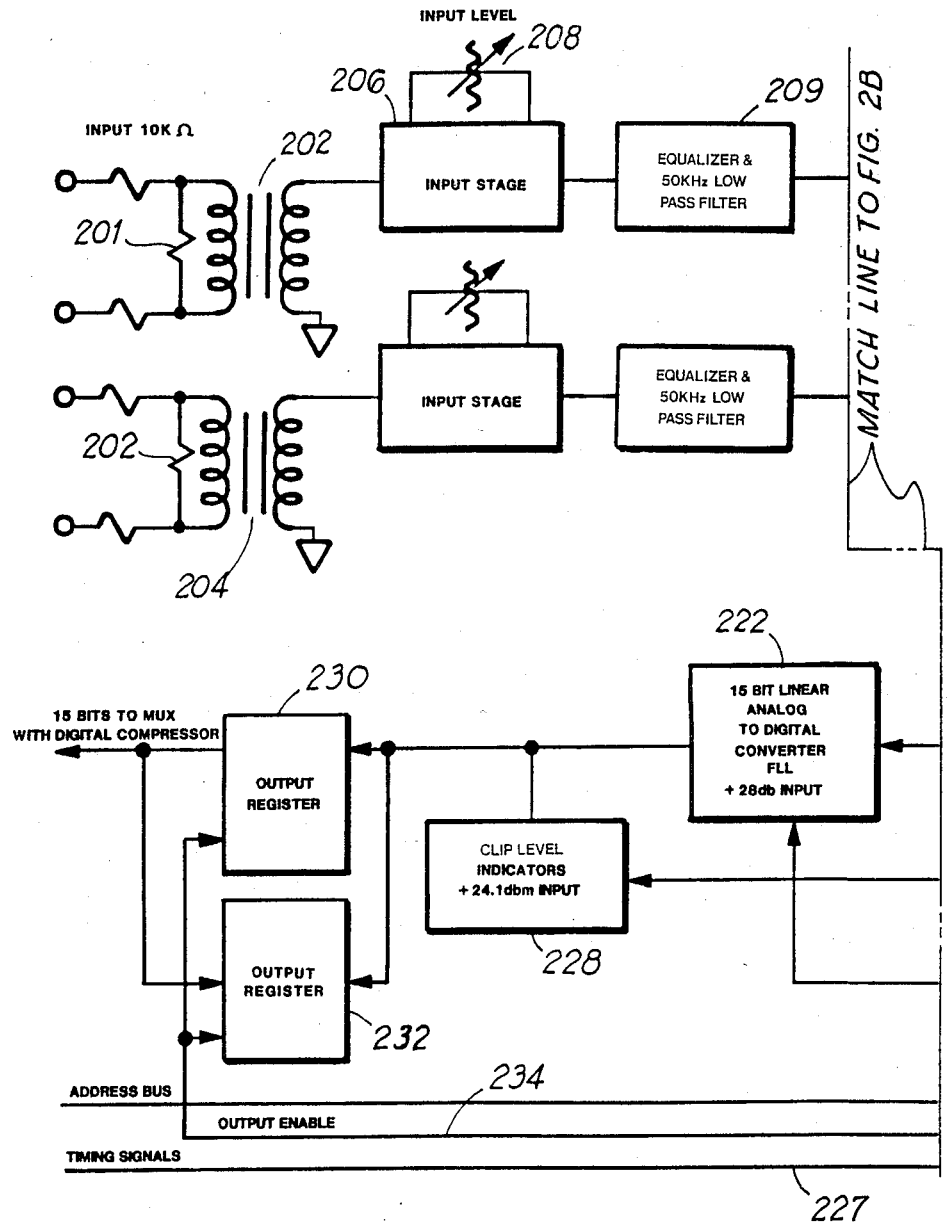
FIGS. 2A and 2B are block diagram of one source encoding channel of the source encoders 104 shown in FIG. 1.
Figure 2B:
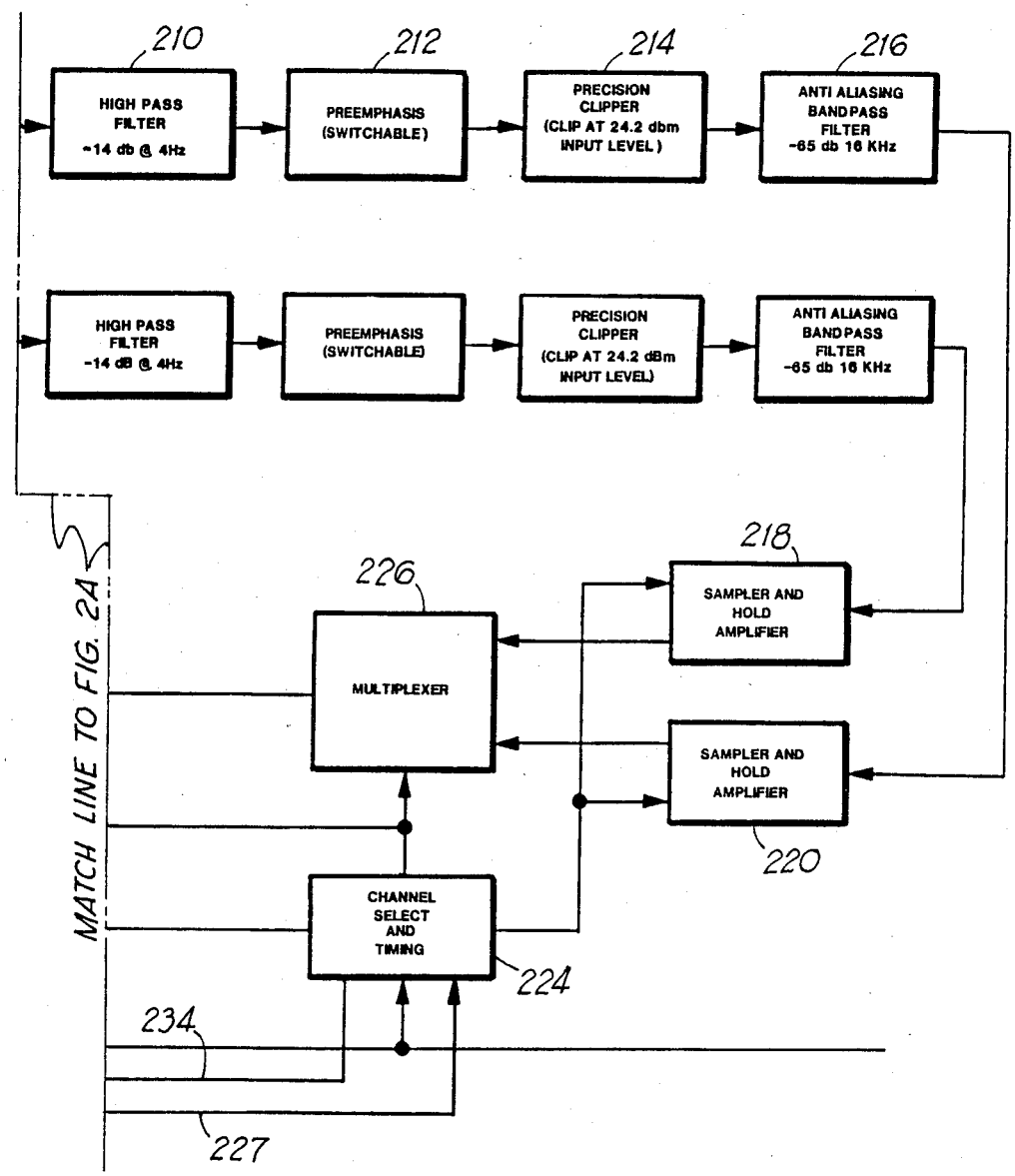

The source encoding block diagram of FIG. 2 illustrates the signal flow within the 15 KHz dual audio channel source encoding stage of the present invention. Where convenient in the following discussion and to avoid duplication, only one channel of duplicate channels and associated circuitry will be discussed.

The channel unit audio inputs at input transformers 202 and 204 in FIG. 2 provide balanced and floating 10K ohm terminations for two audio sources. Input transformers 202 and 204 are interfaced to the audio sources through resistive pads 201 and 203 to reduce the level of the signals to input transformers 202 and 204. This reduction in signal level allows a smaller transformer core size while still achieving low total harmonic distortion (THD) with peak level low-frequency signals. The input pads 201 and 203 also lessen the effects of interactions between reactive sources and the input impedance of the transformer. Use of alloy core transformers for input transformers 202 and 204 provides very low distortion and flat broadband frequency response. The transformers 202 and 204 should also be provided with magnetic and electrostatic shielding to provide reduction in crosstalk between adjacent input transformers and shielding from radiated interference present at transmitting sites.

The secondaries of the input transformers 202 and 204 are single-ended and are terminated to provide good square wave response and passive low-pass filtering. Input stage 206 and input gain adjustment 208 provide the proper operating level for the channel having input pad 201, which channel will be further described in the following. The only gain adjustment for the channel source encoding circuitry is in the input stage because all gain levels in subsequent stages are optimized with respect to their useful dynamic range in relation to the A/D converter saturation level. Gain adjustment 208 acts on a feedback circuit within input stage 206, in order to set the maximum level of the input signal that can be passed through the channel.

Following input stage 206, an equilizer and low-pass filter 209 is used to equalize the frequency response of the terminated transformer 202 and provide an ultimate 3-pole, low pass response.

The terminated transformer 202 and filter 209 serve to provide an initial bandwidth limit to any out-of-band signals, such as radio frequency interference (RFI) or tape recorder bias, and also to reduce the performance required of later filter stages. Filter 209 is designed in accordance with the teaching of R. P. Sallen and E. L. Key, "A Practical Method of Designing R.C Active Filters," *IRE Trans. on Circuit Theory*, pp. 74–85, March 1955 (hereinafter referred to as the "Sallen and Key Article"), which is incorporated herein by reference.

Optimum operation of the present invention requires that the voltage levels in the input stage amplifier 206 and low pass filter 209 and in the stages to follow be maintained at a level that ensures that slew rate limiting and saturation do not occur and that the wide dynamic range (120 dB) of the operational amplifiers of all stages is effectively utilized.

Low-pass filter 209 is followed by a second-order active high-pass filter 210 with 3-dB point at 8.76 Hz. This filter is used to limit the low-frequency response of the channel so that infrasonic (subsonic) audio signals such as record warps, tone arm resonances and ventilation resonances cannot cause converter overload or output transformer saturation. High pass filter 210 should provide more than 16 dB of attenuation at 4 Hz in order to adequately prevent channel overload by low frequency signals. Design of high pass filter 210 may also be accomplished in accordance with the teaching of the Sallen and Key Article.

Optional preemphasis conforming to the International Telegraph and Telephone Consultative Committee (CCITT) Recommentation J17, with −6.5 dB at 800 Hz, is provided in preemphasis stage 212 so that the improvements in signal-to-noise and click reduction which are provided by the corresponding deemphasis network in decoder 132 (FIG. 1) may be utilized to improve signal quality. Design of this stage may also be accomplished in accordance with the teaching of the Sallen and Key Article.

To insure that the analog-to-digital (A/D) converter 222 (further described below) is not driven into saturation when the input to the channel is over-driven, the input signal conditioned by stages 206, 209, 210 and 212 should be precisely limited at +0.2 dB above the peak input level for the channel by a precision clipper 214. A precision diode bridge clipper of the type described in Stout and Kaufman, *Handbook of Operational Amplifier Circuit Design* (McGraw-Hill 1976) ISBN 0-07-061797-X, which is incorporated herein by reference, may be used to provided symmetrical clipping with fast recovery. The clipper 214 prevents converter saturation and has less measurable or human-perceivable distortion than a number of the more complex alternative techniques employed for FM deviation limiters, such as Harris dynamic transient response filters.

To bandwidth limit the audio signal to less than one-half the 32 kHz sampling frequency used for a 15-kHz audio channel, a less than 0.15-dB ripple, elliptic filter with greater than 65-dB stop band rejection above 16 kHz is used for 15-kHz anti-aliasing filter 216. The greater than 65 dB attenuation of the stop band is adequate to guarantee that the aliased components will be below the converter noise floor for all but rare full-level high-frequency synthetically-generated tones. Filter 216 may be either active or passive; such a passive filter may designed in accordance with the teaching of Anatol I. Zverev, *Handbook of Filter Synthesis* (John Wiley and Sons, 1976), which is incorporated herein by reference.

To prevent the input voltage to A/D converter 222 from varying during the time it takes to complete a conversion, the filtered audio signal from each channel is sampled and held in conventional sample-and-hold amplifier 218 or 220, which sample the input signals from their respective channels simultaneously. The sample-and-hold amplifiers 218 and 220 and A/D converter 222 are operated at a 32 kHz clock rate provided by channel select and timing stage 224. This sampling rate conforms to the standard for broadcast digital audio recommended by CCITT Report 647-1. A highly reliable hybrid circuit module, which is compatible with A/D converter 222, is used in the preferred embodiment for the sample-and-hold amplifiers 218 and 220 and multiplexer 226. This module is Analogic MP282, available from Analogic Corporation, Audubon Rd., Wakefield, Mass. 01880. The circuitry of the sample and hold amplifiers 218 and 220 should have a sufficiently high white noise floor to guarantee one least significant bit of dither in the A/D converter. Channel select and timing stage 224 utilizes conventional logic.

The outputs of the sample-and-hold amplifiers 218 and 220 are presented to A/D converter 222, one at a time, under the control of the timing logic provided by channel select and timing stage 224 and multiplexer 226. Multiplexer 226 allows A/D converter 222 to be shared by two channels.

The sample-and-hold input signal to A/D converter 220 must be converted to a 15-bit digital word in less than 12 $\mu$S. It is essential that the precision of the 15-bit words, especially at low signal levels, be maintained throughout the useful life of the A/D converter 222 to satisfy total harmonic distortion (THD) and signal-to-noise performance requirements. The precision of the 15-bit word decision levels, their differential linearity, determines the ultimate noise floor and the THD of the system. The sample-and-hold amplifiers 218 and 220, the A/D converter 222, and the multiplexer 226 operate under the control of timing signals 227 from the terminal multiplexer 106 (shown in FIG. 1 and further described below).

Since the differential linearity specification of A/D converter 222 is so critical for audio applications, it must be conservatively guaranteed in the converter design. This is accomplished by the architecture of the A/D converter. Furthermore, because the "soft" failure of a data converter, i.e., its failure to meet specifications while continuing to function, is difficult to detect without involved system performance tests and requires expensive converter replacement if it occurs, special consideration should be given to the selection and design of the A/D converter 222. A/D converter 222 may be an Analogic MP2735 module, which is used in the preferred embodiment of the present invention.

In audio transmission and reproduction, the dynamic range of a channel is used to best advantage when the peaks of the program material are adjusted to the level where distortion just begins to increase. In any digital audio channels, this level corresponds to one which causes the signal amplitude peaks to cause A/D converter 222 saturation codes to be produced (all 1's or all 0's out of the converter). Because of the amplitude peaking of the clipped input signals occurring during input overdrive, the actual level which is detected is at least 4 dB below A/D converter 222 saturation level. Accordingly, a clip level indicator circuit 228 samples A/D converter 222 output signal to detect the pulse code modulation (PCM) codes which exceed this level during any 31.25 $\mu$s sample period and signals the presence of such excessive levels via a light emitting diode (LED) on the equipment front panel. During normal operation, the optimum drive level of the channel may easily be determined by increasing or decreasing the level presented to the channel until the level indicator 228 flashes infrequently on program audio peaks. Such a level indicator provides a highly precise reference level for all channel signal measurements. Since indicator 228 signals the maximum level at which a signal will pass through the channel unaltered, it is very useful in setting the headroom allocation and provides a reference level for signal to quantization noise distortion ($S/N_D$), total harmonic distortion (THD) and dynamic range measurements.

The 15-bit pulse code modulation words from A/D converter 222 are passed to output holding registers 230 and 232 and then over the parallel data bus to the terminal multiplexer and digital compressor 106 (shown on FIG. 1). Output holding registers 230 and 232 are controlled by channel select and timing stage 224 through output enable lines 234.

b. DIGITAL COMPRESSION

The digital compressor portion of stage 106 assigns an 11-bit representation to each 15-bit PCM word from A/D converter according to an algorithm.

Figure 3:
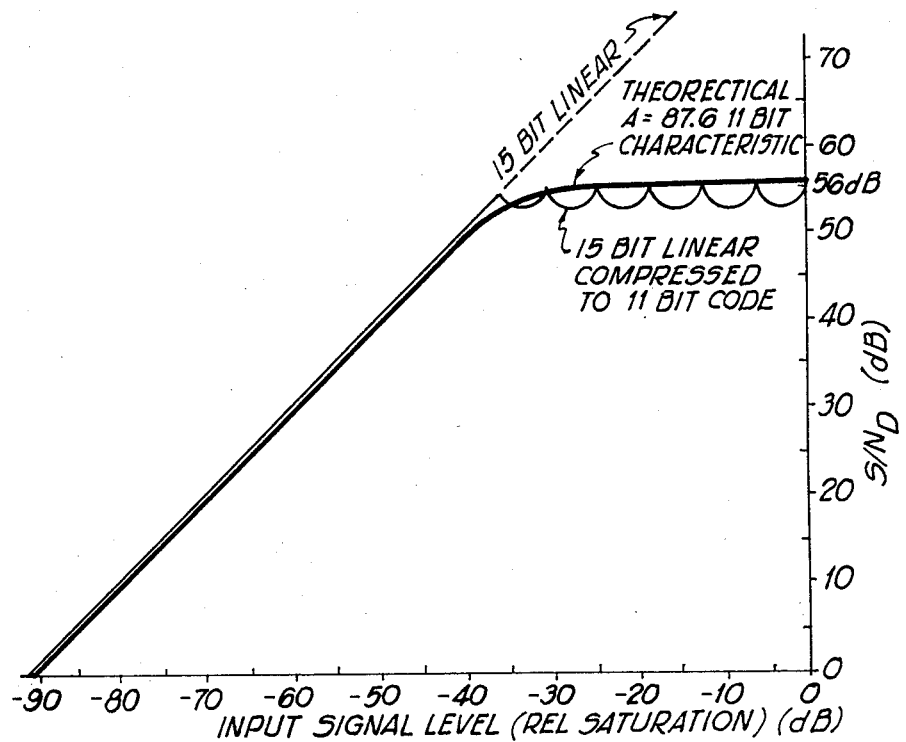
FIG. 3 is a comparison between the digital compression characteristic achieved in the equipment and the theoretical 11-bit A law (A=87.6) compression characteristic.

The compression algorithm used achieves a binary coded digitally linearizable 13-segment approximation of a logarithmic compression characteristic. FIG. 3 shows the compression characteristic with an 11-bit A=87.6 characteristic shown for reference. Peak signal-to-quantization noise distortion ($S/N_D$) is 56 dB, and a dynamic range of greater than 82 dB is achievable with 15-bit converter equipment. The digital compression is implemented by converting the parallel, 15-bit, offset binary, digital output of A/D converter 224 to an 11-bit code with inverted, folded, binary structure in accordance with the teaching of the *CCITT Orange Book*, Volume III (3 parts), "Line Transmission," published by the International Telecommunications Union, 1977, which is incorporated herein by reference. The code mapping of the present invention is presented in FIG. 4, which shows the compressed code assigned to positive, 15-bit, input words (Sign bit, Most significant bit (MSB) =1) in each of the cords of the seven segment approximation to the positive half of the logarithmic companding characteristic.

Parallel conversion provides a reduction in the hardware and timing complexities required to implement the design. Because the compressor may operate at high speeds, it may be shared by many channels and is therefore economically incorporated into the digital compression, TDM multiplexer and scrambler 106.

It should be noted that the compressed code limits the signal to quantization noise ratio ($S/N_D$) at high signals levels (cords 2 through 7 of FIG. 4) to a 56-dB peak. This is because the output word at these levels is limited to nine bits of resolution:

$$S/N_D = (20 \log 2^9) + 1.8 \text{ dB} = 56 \text{ dB}.$$

However, in the first two cord segments (cords 0 and 1 of FIG. 4), the low level resolution of the 15-bit PCM code is fully preserved. This provides a low idle channel noise floor and allows the wide dynamic range required for high quality audio reproduction.

In the preferred embodiment of the present invention the compressor portion of compressor, TDM multiplexer and scrambler stage 106 is a conventional programable read only memory (PROM) circuit.

c. TIME DIVISION MULTIPLEXING OF CODED CHANNELS

The digitized audio channel inputs from source encoder 104 in FIG. 1 which have been digitally compressed in stage 106 are then combined, or time division multiplexed, also within stage 106, into a single data stream.

Figure 12:
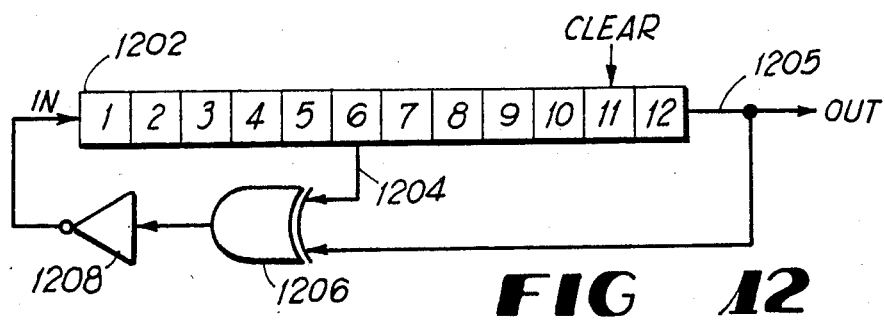
FIG. 12 is a block diagram of the pseu number generator utilized in digital compre multiplexer and scrambler 106.

First, each 15 kHz audio channel is sampled at a 32 kHz rate, each 15 bit sample having been compressed to 11 bits as described above. A 12th bit or parity bit is added to each 11 bits for error concealment. Thus, each sample provides a 12-bit word and each channel generates a 12 bits per sample times 32,000 samples per second, or a 384 kb/s data stream. The composite 7.68 Mb/s data output stream output from the multiplexer of stage 106 is composed of twenty 384 kb/s data streams and is scrambled to provide a desirable power bandwidth spectrum for BPSK modulation and demodulation. Scrambling is accomplished by applying the 7.68 Mb/s data stream and the output of a pseudorandum number generator circuit to an exclusive-OR circuit which outputs a scrambled 7.68 Mb/s data stream. The pseudorandum number generator circuit utilized in the preferred embodiment is illustrated in FIG. 12, which is further described below in connection with description of the descrambler, TDM demultiplexer and digital expander 130 illustrated in FIG. 10. Each 384 kb/s channel can support, for instance, either one 15 kHz bandwidth program, two 7.5 kHz bandwidth programs, twelve 32 kb/s auxiliary channels (for voice cue or data), or one 7.5 kHz program channel and six 32 kb/s auxiliary channels. One 32 kb/s auxiliary channel slot may conveniently be reserved for system synthronization.

The time division multiplex framing rate is then determined as follows:

TDM frame rate =

$$\frac{12 \text{ bits}}{\text{word}} \times \frac{12 \text{ words}}{\text{channel}} \times \frac{20 \text{ channels}}{\text{frame}} = 2880 \text{ bits/frame}$$

A typical frame format for the present invention is shown in FIG. 5. Frame 502 consists of twelve words 504 numbered "0" through "11" in rows 506 within each of twenty channels shown on columns 508 numbered "0" through "19." One of the words 504 within frame 502 is a system synchronization word 510, shown in the word "11," channel "19" position.

d. DIFFERENTIAL ENCODING AND BIT INTERLEAVING

The composite 7.68 Mb/s data stream from digital compression and TDM multiplexer 106 is then both differentially encoded and bit interleaved in stage 108 of FIG. 1. Differential encoding in accordance with the teaching of James J. Spilker, Jr., *Digital Communications by Satellite* (Prentice-Hall, 1977) pp. 300-301, which is incorporated herein by reference, is used to make possible resolution of ambiguity in the demodulation process at the receive only terminal, as is further described below. When an error occurs in a system with differential encoding, errors will appear in groups of two. Therefore, bit interleaving in accordance with the teaching of G. C. Clark, Jr. and J. Bibb Cain, *Error Correction Coding for Digital Communications* (Plenum Press, 1981) pp. 345-352, which is incorporated herein by reference, is used such that the differential decoded output data stream will then have the paired errors separated by several thousand bits. This greatly improves the performance of the error-correction coding further discussed below.

e. FEC ENCODING AND DECODING (GENERALLY)

The present invention employs forward error correction (FEC) coding techniques using convolutional selforthogonal codes (CSOC). CSOC codes form a class of convolutional codes of various code rates and error correction abilities and are discussed in G. C. Clark and J. B. Cain, *Error-Correction Coding for Digital Communications* (Plenum Press, 1981), which is incorporated herein by reference.

In the present invention, an encoder in stage 108 (shown in FIG. 6) with a code generator polynominal G(D) processes the information bits and computes an FEC parity bit which is added to the encoder 108 output bit stream. At the FEC encoder 108 output, one parity bit is added to each 7-bit data word, resulting in an 8/7 increase in the transmission bit rate from 7.68 Mb/s to 8.777 Mb/s.

The FEC decoder within stage 128 processes the received bits which may have been corrupted by channel noise. A parity re-encoder G(D) generates parity from the received data bits. This parity is modulo two compared to received parity bits. The comparison generates syndromes which are shifted into the syndrome register of decoder 128. Threshold circuits within stage 128 then look for various syndrome patterns. The resets to the syndrome register remove the effect of a given error estimate on following error estimates. The general polynominal code utilized in the present invention is:

0, 3, 19, 52, 78, 146
0, 2, 8, 32, 88, 142
0, 11, 12, 62, 85, 131
0, 21, 25, 39, 82, 126
0, 5, 20, 47, 84, 144
0, 58, 96, 106, 113, 141
0, 41, 77, 108, 117, 130

For this rate $\frac{7}{8}$, J=6, $d_{min}$=7 CSOC code, the encoder register and syndrome registers of present invention are 146 bits long. This code can correct any three errors occurring in its constraint length of 1176 bits. At a $10^{-7}$ output bit error rate (BER), this code provides a 3.3 dB gain. FIG. 6 shows a block diagram of the encoder register of the present invention which is one of two realizations of the encoder. The second realization is in the parity re-encoder register 808 of FIG. 8.

As is indicated in FIG. 6, data bits $I_X$, where X=1 through 7, are input at the various points shown, such as 602, 604, 606 and 608, in accordance with the code shown above in a shift register having positions within the register represented by the squares numbered 1 through 146 and exclusive-OR gates represented by circles containing "plus" signs, such as those indicated by numerals 610 and 612. The output parity bit P is output at 614.

The 8.777 mb/s signal output by stage 108 is used to binary phase shift key (BPSK) modulate a carrier which is transmitted to and received from a communication satellite as described above. The RF signal is received at the digital audio receive only terminal by receiving antenna 120 and low noise amplifier 122 and then down converted to a 70 MHz IF by a conventional down converter 124, which may be located within the wideband BPSK receiver 129.

f. BPSK DEMODULATION

Figure 7:
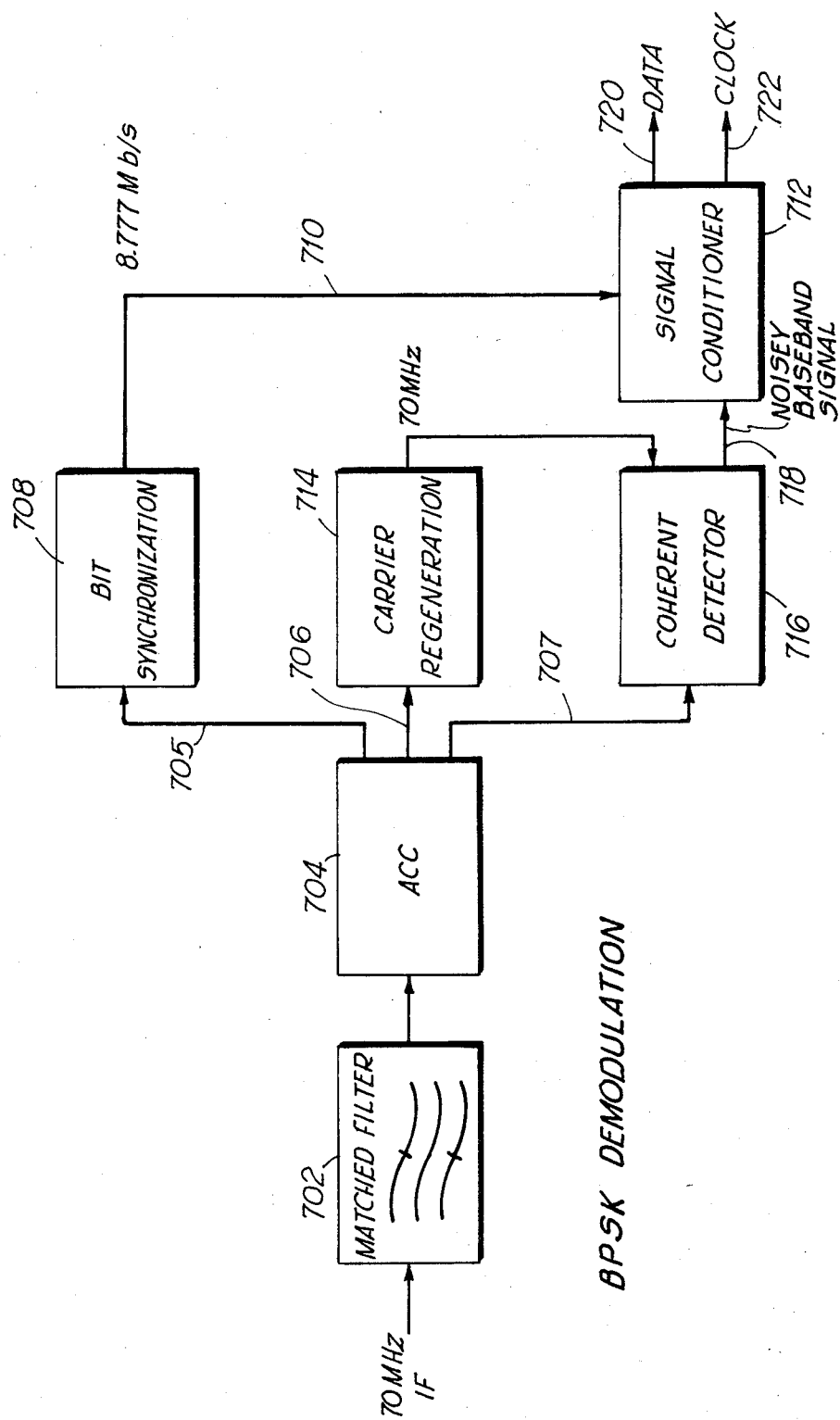
FIG. 7 is a block diagram of the binary phase shift key (BPSK) demodulator contained within BPSK demodulator and differential decoder 126 of FIG. 1.

A block diagram of the BPSK demodulator, which is part of stage 126 in FIG. 1, is shown in FIG. 7. The 70-MHz BPSK modulated signal plus noise from the satellite relay transmission is routed initially through matched filter 702 (in FIG. 7) which is implemented at the intermediate frequency (IF) by using an arithmetically symmetrical intermediate frequency filter designed in accordance with H. Blinchikoff and A. I. Zverev, *Filtering in the Time and Frequency Domains* (John Wiley & Sons, 1976), which is incorporated herein by reference. The analytic low-pass equivalent of this filter is an approximation of the sliding integral matched filter for non-bandlimited NRZ PCM. Placing filter 702 at the input to the demodulator maximizes rejection of interfering signals and enhances the signal-to-noise in the carrier regeneration and bit synchronization circuitry which follows.

The output of filter 702 is automatic-gain-controlled in AGC stage 704 and then split and routed into three paths 705, 706 and 707. Bit synchronization path 705 routes envelope variations at the bit rate due to matched filtering through an even-order nonlinearity in bit synchronization stage 708 to recreate a bit rate spectral component which is then narrowband-filtered, also in bit synchronization stage 708, for memory and signal-to-noise improvement. The output 710 of the bit synchronization stage 708 controls the decision-making process in the signal conditioner 712, where at the end of each bit period a maximum likelihood state-estimate is made on whether a one or zero is sent over the satellite during that bit period.

The second output 706 of AGC stage 704 is routed to carrier regeneration stage 714. In the carrier regeneration stage 714, again, the output of the even-order nonlinearity contains a times-two component which modulo two pi wipes off the carrier modulation since the original carrier modulation was either zero radians or pi radians, which multiplied by two will give multiples of two pi radians, or an essentially unmodulated carrier at twice the carrier frequency. This signal is filtered for signal-to-noise enhancement and then divided by two within carrier regeneration stage 714 and routed to coherent detector stage 716 with the proper phasing to provide coherent reference for demodulation.

The third output 707 of AGC stage 704 is routed to coherent detector 716 where it is mixed with the regenerated coherent reference signal from carrier regeneration stage 714 to produce a baseband output signal 718 which contains the desired baseband signal and (undesired) noise. The output 718 of coherent detector 716 is filtered in signal conditioner 712 to remove carrier reference leak-through and double-frequency terms and is then compared to a reference level signal in order to make a maximum likelihood state estimate. At the end of each bit period, a state-estimate is made in signal conditioner 712 under control of reconstructed clock signal 710 from the bit synchronizer 708. The output data estimate 720 at 8.777 Mb/s data rate is also differentially decoded in signal conditioner 712 and then routed to the FEC decoder portion of bit deinterleaver and FEC decoder stage 128 (of FIG. 1) along with the reconstructed bit rate clock signal 722.

g. FEC DECODING

The FEC decoder portion of stage 128 processes the output of the BPSK demodulator of stage 126 to correct errors that occur in transmission and performs the following functions:
 (a) Generation of a bit rate (BR) clock from the 8/7 BR clock from the BPSK demodulator clock 722 of FIG. 7.
 (b) Bit deinterleaving.
 (c) Error correction decoding to reduce the overall bit error rate (BER).

Figure 8:
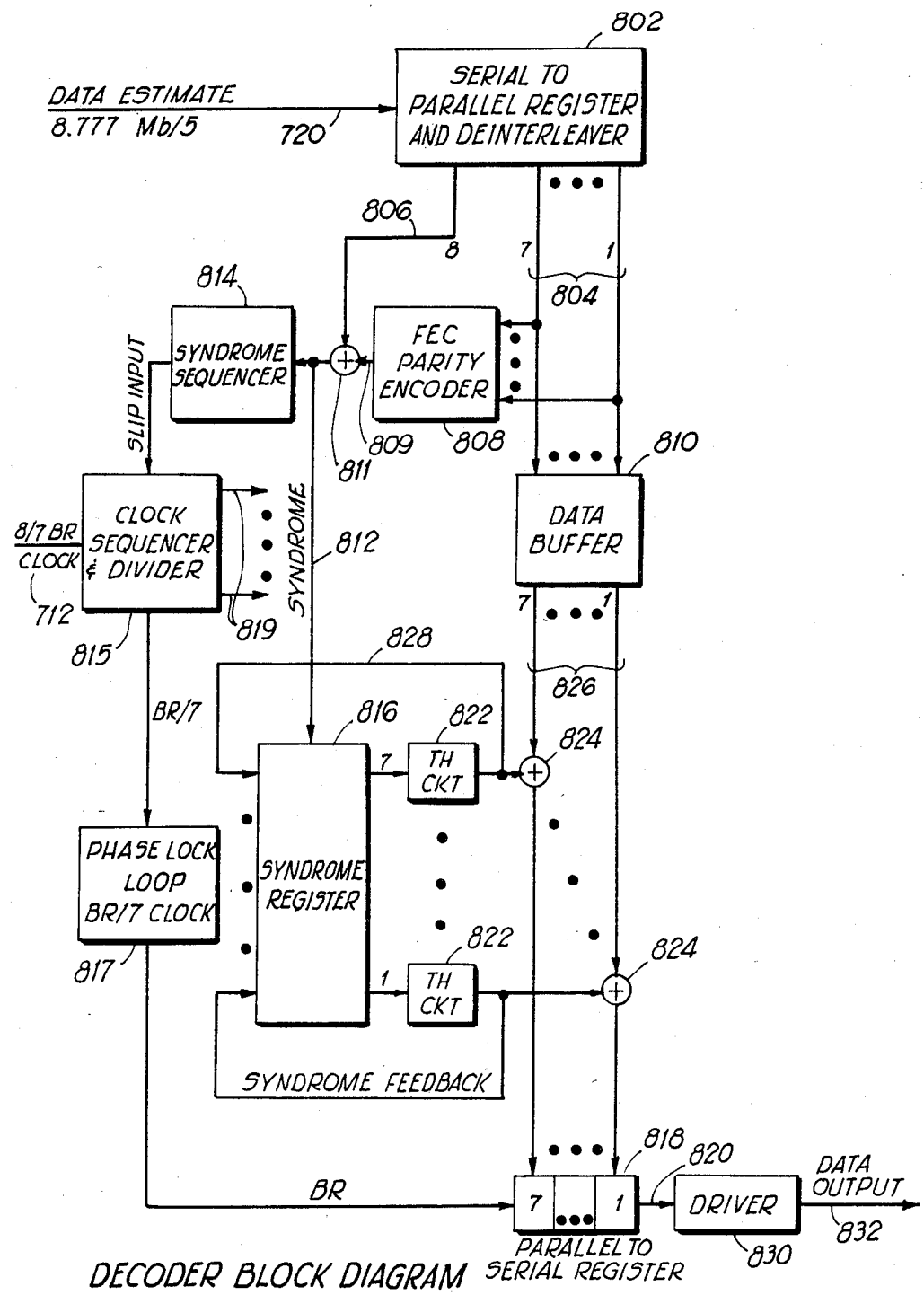
FIG. 8 is a block diagram of the bit deinterleaver and FEC decoder comprising stage 128 in FIG. 1.

FIG. 8 is a block diagram of the threshold decoder of stage 128. Data estimate 720 from the BPSK demodulator 126 is applied to series-to-parallel register and deinterleaver 802 which splits the data estimate 720 into an eight-bit parallel data stream comprising information bits 804 and one parity bit 806. Information bits 804 are transmitted to the parity re-encoder 808 and the data buffer 810. The FEC parity re-encoder 808 (which utilizes a shift register functionally identical to the encoder register shown in FIG. 6) encodes the parallel information bit stream 804 by the same process as that used by the transmit stage 108. Transmitted parity 806 and regenerated parity 809 are modulo two added to generate syndrome bits 812 in exclusive-OR gate 811. If no error occurs in the transmission of the data, the received and transmitted bits are the same; thus, the received parity and re-encoded parity generated by the received data are the same. In this case, the syndrome bits 812 which represent a comparison of receive parity and reencoded parity, are all "Zeroes." Syndrome bit "Ones" occur when the two parity bits do not agree, indicating that one or more transmission errors have occurred.

Syndrome sequencer circuit 814 monitors the number of syndrome bit "Ones" produced. If the number of syndrome "Ones" averages greater than $33\frac{1}{3}\%$ with respect to the total number of syndrome bits, then the syndrome sequencer will force the clock sequencer 815 to slip the BR/7 clock to the serial to parallel (SIPO) register 802 by one 8/7 bit-rate cycle so that the data advances by one bit in the SIPO register 802. The syndrome sequencer resumes inspecting the ratio of syndrome "Ones" to total syndrome bits. When a state is found which has less than $33\frac{1}{3}\%$ syndrome bit "Ones" (an uncoded BER of $5.9 \times 10^{-3}$), the syndrome sequencer 814 does not cause permutation and declares lock. After lock is achieved, error correction may begin.

Figure 9:
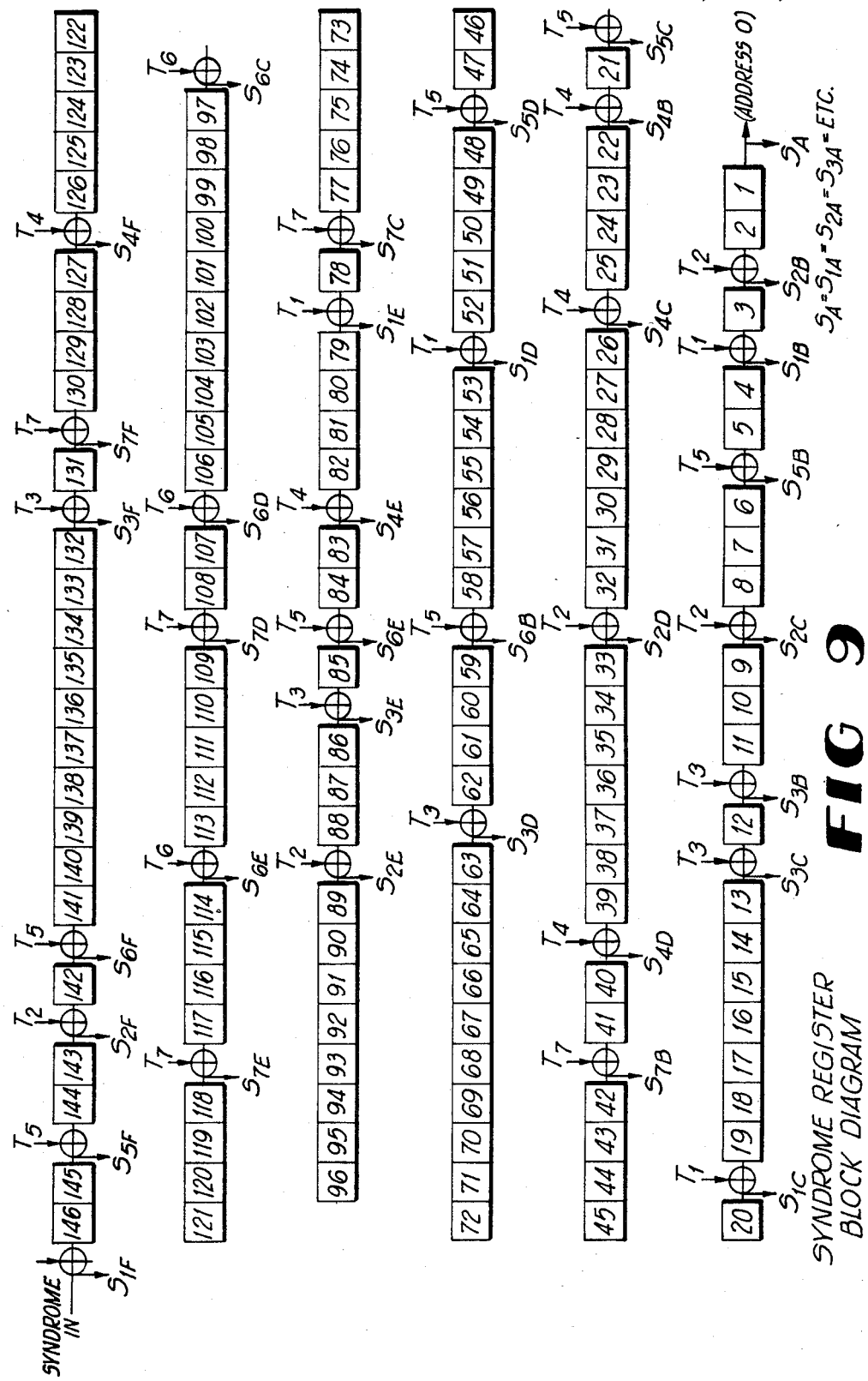
FIG. 9 is a block diagram of syndrome register 816 i FIG. 8.

Syndrome register 816, shown in block diagram form in FIG. 9, shifts in syndrome bits at 812 of FIG. 8; these bits begin filling the 146 cell register 816. As the syndrome bits shift through the register 816, the seven threshold circuits 822 of syndrome register 816 each search for specific syndrome patterns caused by bit errors to determine if an error has occurred. When an error is detected, one of the seven threshold circuits 822 outputs a correction signal to the proper exclusive-OR gate 824 connected to the data buffer 810 output 826. The threshold circuits 822 also invert the appropriate syndrome bits in the syndrome register 816 to conform the syndrome register 816 contents to the corrected data stream. The data buffer 810 also delays the data bits in each bit stream 804 by approximately 146 BR/7 periods so that the correction signal 825 output by each threshold circuit 822 will be aligned with the proper bit to be corrected. A parallel-to-serial register 818 converts the seven corrected information bits into a bit-serial stream 820.

The syndrome sequencer 814 works as follows. When a syndrome "One" is encountered, the state of the syndrome sequencer 814 is incremented by 2, and when a "Zero" is encountered, the state is decremented by 1. If the net movement is downward, then the sequencer counts down to "Zero" and holds; if the net movement is upward, it counts up to 127, outputs a pulse to force the clock sequencer 815 to slip one 8/7 BR cycle, and resets to zero.

The clock sequencer 815 divides the 8/7 BR signal 712 down to the several timing signals indicated by arrows 819 required by the rest of the decoder illustrated in FIG. 8. When the slip input from the syndrome sequencer 814 is true, then the clock sequencer 815 halts until it becomes false.

The phase locked loop 817 derives a BR signal from the BR/7 signal provided by the clock sequencer 815. This BR signal is required to clock the data going out of the decoder of FIG. 8 since the parity has been stripped from the incoming data stream and the rate of the data has been reduced from 8/7 BR to BR.

Finally, a driver circuit 830 provides the desired level interface signal 832 to the descrambler and TDM demultiplexer portion of descrambler, TDM demultiplexer and digital expander stage 130 (FIG. 1).

h. TDM DEMULTIPLEXING AND DIGITAL EXPANDING

Figure 10:
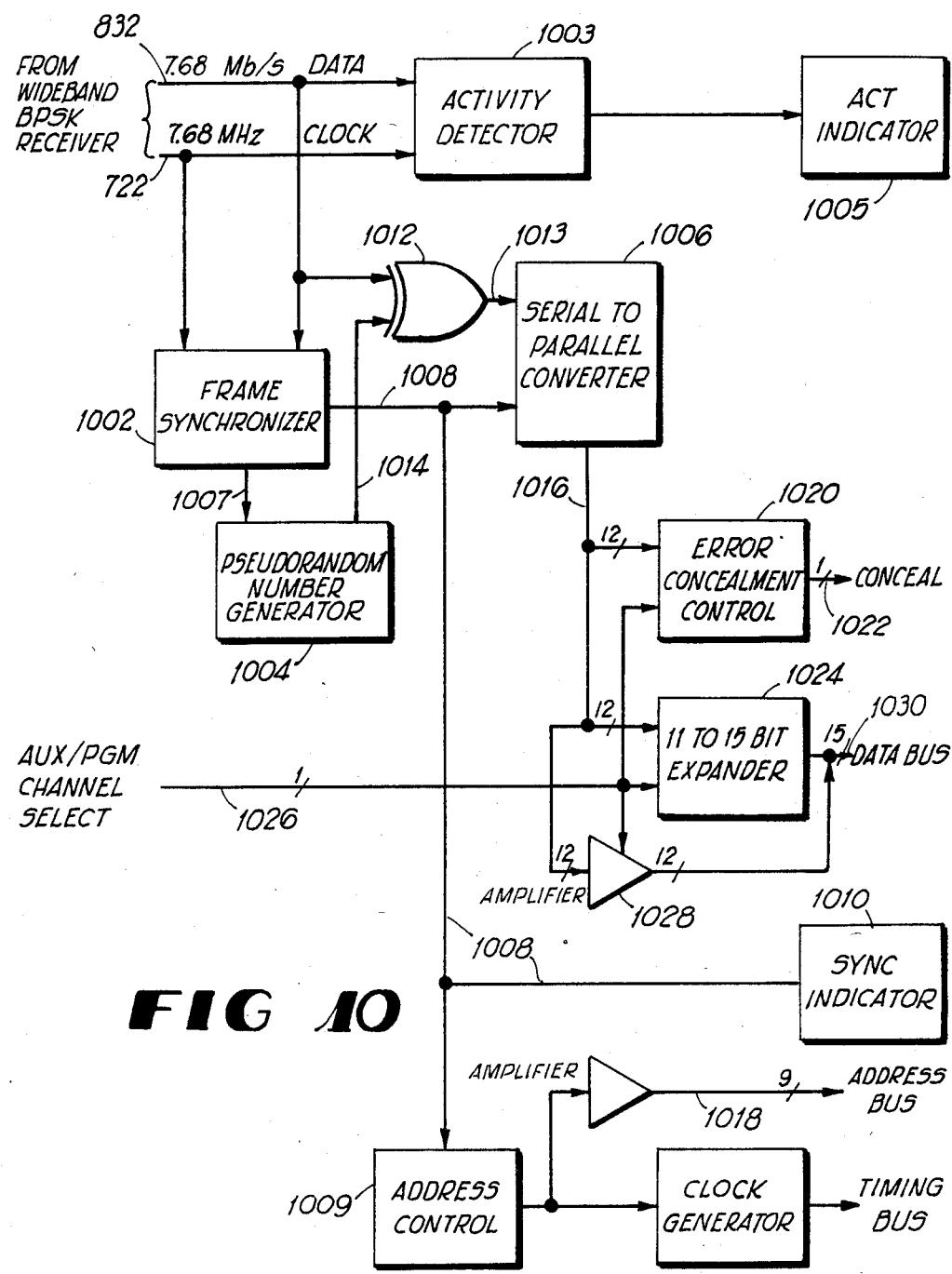
FIG. 10 is a block diagram of the descrambler time division multiplex demultiplexer contained w descrambler, TDM demultiplexer and digital exp 130 in FIG. 1.

A block diagram of the descrambler and TDM demultiplexer portion of stage 130 is shown in FIG. 10. The data line 832 and clock line 722 from the WBPSK receiver 129 comprising stages 124, 126 and 128 (of FIG. 1) are used in the frame synchronizer 1002 to derive frame synchronization and pseudorandum number generator control signals. As discussed above, the "frame" utilized by the present invention consists of twelve words from each of the twenty channels. One of the words within the frame is a system synchronization word. Each of the words is twelve bits long. Thus, the total frame length is 2,880 bits.

Frame sychronizer circuit 1002 searches, verifies, and then locks to the code word of the incoming data stream 832. Upon acquiring lock, frame sychronizer 1002 initializes pseudorandom number generator circuit 1004 via signal 1007 and serial-to-parallel converter circuit 1006 via signal 1008. Frame synchronizer circuit 1002 also synchronizes address control circuit 1009 to the frame rate and lights SYNC indicator 1010 to signal that synchronization has been achieved.

Address control circuit 1009 counts the number of words which have occurred since the last frame synchronization word in order to calculate the word number and channel to which a current word belongs. The word and channel number form a 9-bit output which is placed on the address bus 1018. The activity detector circuit 1003 lights the activity (ACT) indicator 1005 to indicate when the clock and data signals are present.

Pseudorandom number generator circuit 1004 is used in descrambling the incoming data stream by generating a pseudorandom number sequence identical to the one utilized in the TDM multiplexer of stage 106.

The pseudorandum number generator utilized in both digital compressor, TDM multiplexer and scrambler 106 and stage 130 is illustrated in FIG. 12. It utilizes a 12-bit shift register 1202 with a feedback loop 1204 at bit number 6 which is input, together with the register output 1205 to an exclusive-OR gate 1206, the output of which passes through an inventer 1208 which feeds the input (bit 1) of shift register 1202.

The generator 1004 in the TDM demodulator descrambler illustrated in FIG. 10 is cleared by a signal from frame synchronizer 1002 at two times the frame rate in order to synchronize the transmit and receive bit streams. The output 1014 of generator 1004 is input, together with the scrambled data stream 832, to exclusive-OR gate 1012, which outputs a descrambled data stream 1013 to serial-to-parallel converter 1006.

Serial-to-parallel converter 1006 outputs 12-bit data words at 1016. These 12-bit words are processed in one of two possible fashions under the control of the select line signal 1026. Select line signal 1026 is originated by the channel unit whose address matches the current address bus value and acts on gate 1028, control 1020 and expander 1024. If the channel unit being addressed is a program audio unit, it will force the AUX/PGM channel select line 1026 to the "program" level. If the channel unit being addressed is an auxiliary unit such as voice cue or data card, then the AUX/PGM channel select line 1026 will be forced to the "auxiliary" level.

If a word in output 1016 belongs to a program audio channel as indicated by its word and channel number "address" within the frame, error concealment control 1020 checks the parity and uses the conceal line 1022 to cause the previous value to be held in a register (not shown) in the event of an error. The 11-to-15 bit expander 1024 accepts the 11-bit word (excluding the parity bit) and expands it into a 15-bit word using the 15-bit linear to 11-bit compressed code set forth in FIG. 4. Finally, the 15-bit output word is placed on the data bus via line 1030 if the Auxiliary/Program (AUX/PGM) channel select line 1026 is at the "program" state or level. If the select line 1026 is at the "auxiliary" level, the 12-bit word on line 1016 will bypass expander 1024 via gate 1028 and enter data bus 1030 unaltered.

i. 15 KHZ AUDIO CHANNEL SOURCE DECODING

Figure 11A:
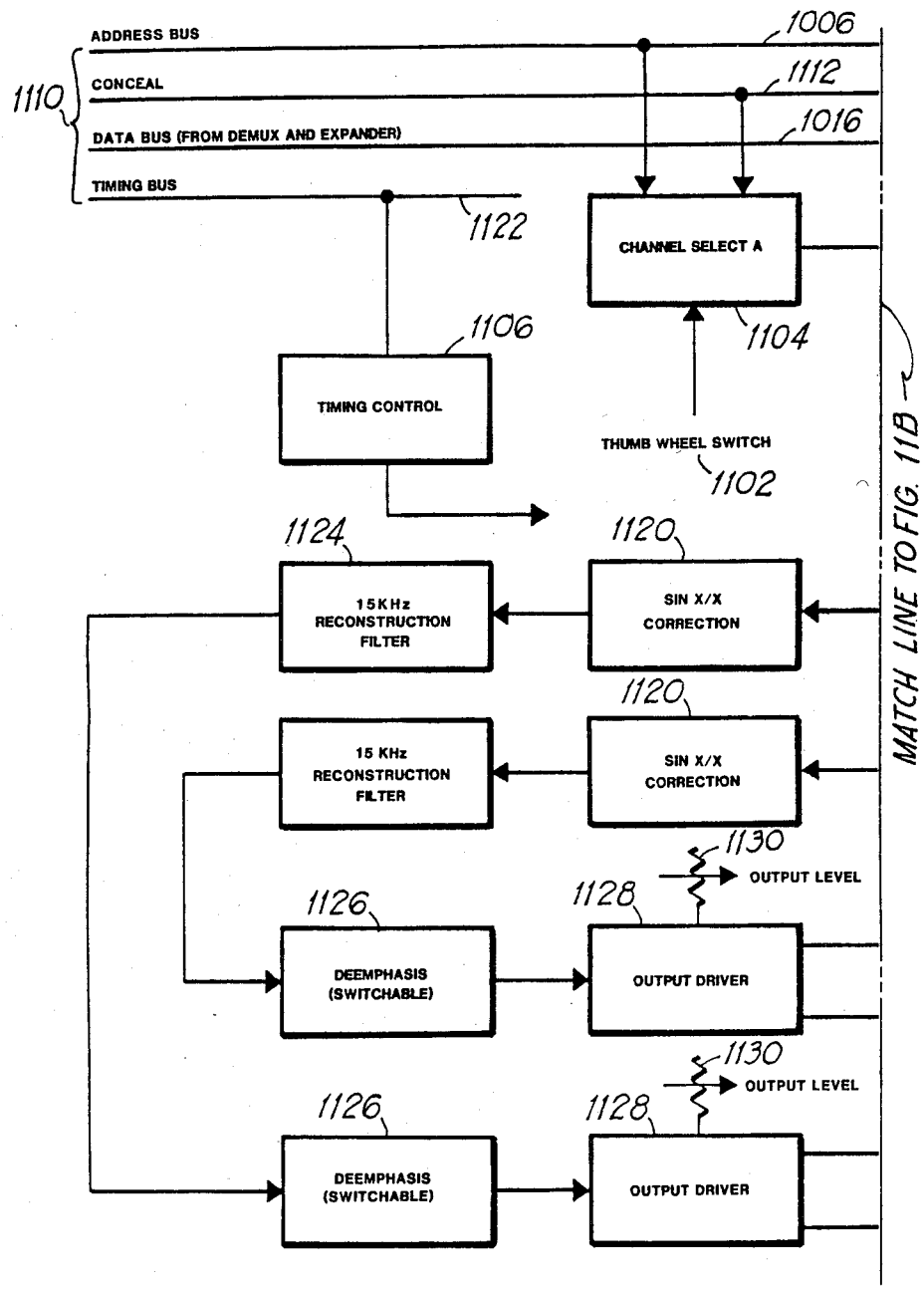
FIG. 11 is a block diagram of one source d channel within source decoders 132 of FIG. 1
Figure 11B:
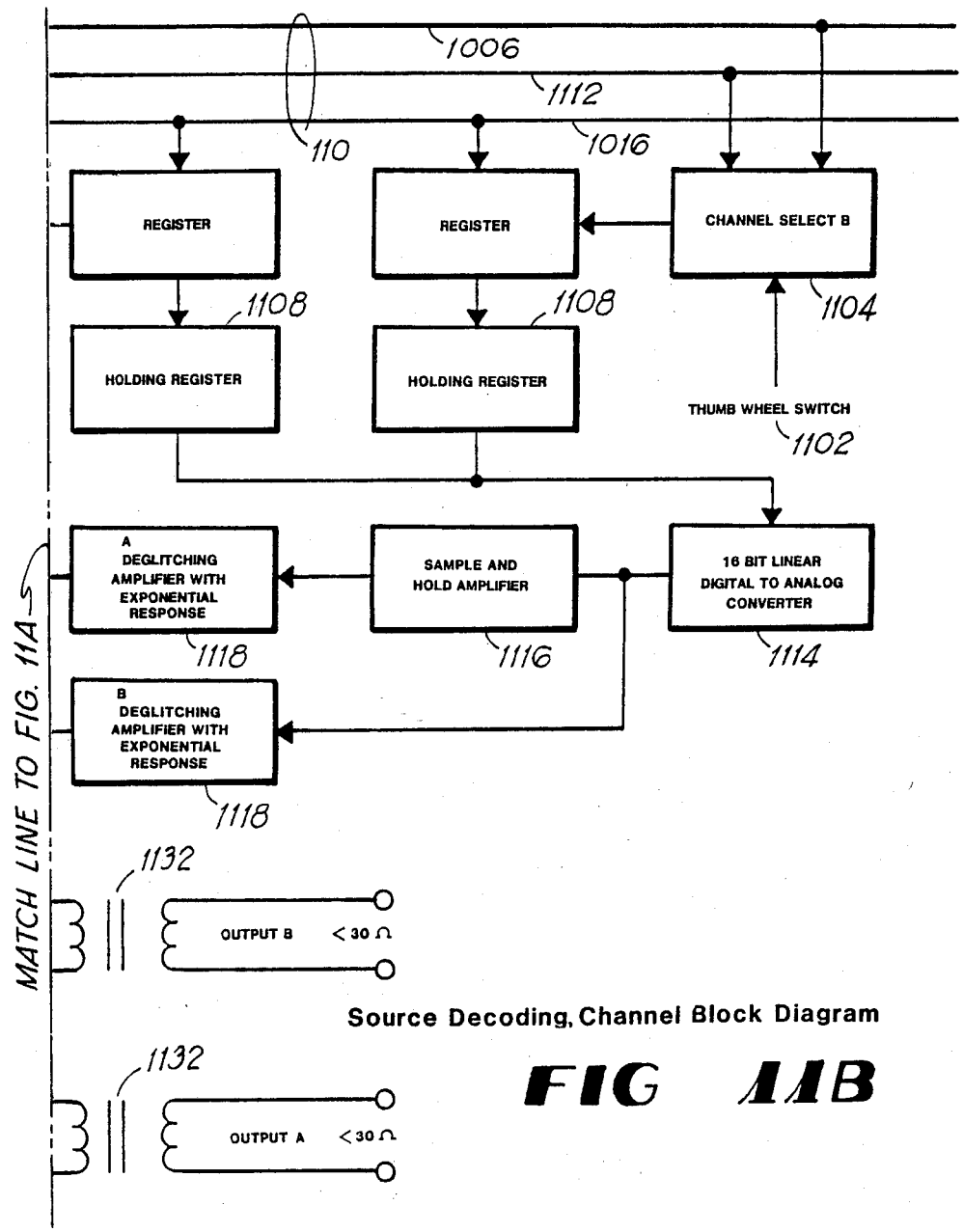

The block diagram of FIG. 11 illustrates signal flow for the channel source decoder 132 of FIG. 1.

Channel selection thumbwheel switches 1102 acting on address comparators set the codes which specify the address of a channel selected. The channel select logic 1104, timing control logic 1106, and storage registers 1108 are used to sequentially process the digitally expanded data removed from data bus 1016 so that two analog signals may be output simultaneously.

Conceal line 1112 from terminal demultiplexer 130 (FIG. 1) signals if a parity error occurs in a word received for the channel. If an error is detected, the previous valid word from the demuliplexer is retained in the register. If no error is detected, the new word is entered into the register. This form of "error concealment" serves to reduce the perceived effects of channel bit errors.

The D/A converter 1114 operates on the 15-bit word generated by digital expander 1014 in the demultiplexer shown in FIG. 10 and discussed above to produce a precise analog voltage output which corresponds to a sampled value of the input signal.

The constraints of long-term reliability and stringent differential linearity which were required of the A/D converter 222 in FIG. 2 are necessary for D/A converter 1114.

For the high-speed D/A converter 1114 to be shared by two channels and allow simultaneous output of analog samples, one of the converted samples must be "held" while the other is being converted by D/A converter 1114. This is accomplished in sample-and-hold amplifier 1116, which is of conventional design.

The output of the D/A converter 1114 contains switching transients and data transitions with rise and fall times which can cause slewing distortions. It is therefore necessary to condition the output steps of D/A converter 1114 to obtain a low distortion reconstruction of the input signal. This may be accomplished in distortion suppressors or deglitching amplifiers 1118 for each channel, which are designed in accordance with the teaching of Dennis M. Freeman, "Slewing Distortion in Digital-to-Audio Conversion," *Journal of the Audio Engineering Society*, April 1977, Volume 25, No. 4, pp. 178-183, which is incorporated herein by reference.

The rise time of the data transitions is limited by a time constant incorporated in the switched amplifier of the deglitching amplifier 1118. A fixed rise time (RC=3.4 $\mu$s) in the preferred embodiment limits the slew rate of the signal and reduces the slew rate requirements of the deglitching amplifier 1118 and following stages so that slewing distortion is not encountered. The frequency response roll-off caused by the RC filter may be corrected in an active (sin X)/X correction filter 1120 for each channel which is designed in accordance with the teaching of the Sallen and Key Article.

The timing for the deglitching amplifiers 1118 is obtained from the terminal demultiplexer shown in FIG. 10 via timing bus 1122 and timing control 1106. Deglitching amplifier 1118 samples the D/A converter 1114 output after its switching transients have decayed to a suitable level (less than 6 $\mu$s). Deglitching amplifiers 1118 must be allowed to track D/A converter 1114 output for at least three time constants (3RC=10.2 $\mu$s) so that flat frequency response and a high signal-to-noise ratio (S/N) are maintained through the deglitching amplifiers 1118. The output of each deglitching amplifier 1118 takes on the stepped form of a zero order hold with exponential rise and fall times.

The output frequency response of the sampled data stream using a zero order hold has a (sin X)/X shape. The sampled data (sin X)/X spectrum, the aperture effects of the input sample and hold and deglitcher, and the rolloff caused by the lowpass filter effect of the RC time constant employed in the deglitching amplifier 1118, must be compensated to achieve the flat frequency response required for the high quality digital audio system of the present invention. This is accomplished in (sin X)/X correction stage 1120, which is a two-pole active filter designed to provide the precise compensation necessary to correct the aforementioned terms to within 0.05 dB over the 15-kHz bandwidth of the audio channels.

A bandpass reconstruction filter 1124, similar to that used for the input anti-aliasing filter 216 of FIG. 2, is used for baseband signal reconstruction. The requirements for reconstruction filter 1124 are nearly as severe as those for the anti-aliasing filter 216. High amplitude components of the source signal located at frequencies near the upper cutoff frequency of the channel are folded back in the sampled data spectrum to be presented as nonharmonic, out-of-band, audible components in the signal presented to the reconstruction filter 1124. That is, 15 kHz at +24 dBm input also appears as a 17-kHz component at +22 dBm. Reconstruction filter 1124 must reduce these components and other artifacts below the level of the system noise floor. It is also necessary that reconstruction filter 1124 guarantee that no digital processing artifacts be present in the output to disrupt other equipment to which the signal is routed. Reconstruction filter 1124 should also be constructed to provide reliable, EMI-immune performance. These objectives are accomplished by providing a filter designed in accordance with conventional techniques to meet these requirements.

After filter 1124, optional deemphasis 1126 may be provided to compensate for the use of pre-emphasis 212 in the encoder of FIG. 2. Deemphasis 1126 improves the signal-to-noise ratio for the channel and reduces the perception of bit errors and noise modulation.

The fully reconstructed baseband signal is routed from deemphasis 1126 to output driver stage 1128 for level adjustment and buffering. Output stage 1128 should have the slew rate and current drive capacity required to deliver a low-distortion replication of the reconstructed signal at +24 dBm into a 600-ohm load. A level adjustment 1130 for the output is provided so that the peak output level may be varied. This is normally set to provide unity gain through the channel.

To achieve low distortion at peak signal levels and low frequencies (20 Hz), a specially designed output transformer 1132 is required. It should have a frequency response which is flat within 0.1 dB from 20 Hz to 50 kHz. The output amplifier 1128 is designed with a bridging amplifier which provides a low-impedance source to the transformer 1132. The voltage source drive for the transformer assures low crosstalk between adjacent output transformers and low distortion.

Although the present invention is described and illustrated with detailed reference to the preferred embodiment, the invention is not intended to be limited to the details of such embodiment, but includes numerous modification and changes thereto while still falling within the intent and spirit hereof and the appended claims.

1. A system for processing analog audio and digital data signals and modulating an intermediate frequency carrier for subsequent conversion to a transmission frequency, amplification and transmission comprising:
   (1) a source encoder for converting the analog audio portions of said signals to digital form;
   (2) a digital compressor for compressing the digitized analog audio signals to reduce their data rates;
   (3) a multiplexer for combining into a single data stream the compressed signals output by the compressor;
   (4) a forward error correction encoder for encoding the data stream output by the multiplexer utilizing a convolutional self orthogonal code;
   (5) a bit interleaver for interleaving the bits contained in the data stream output by the forward error correction encoder;
   (6) a differential encoder for differentially encoding the data stream output by the bit interleaver; and
   (7) a binary phase shift key modulator for modulating the data stream output by the differential encoder at an intermediate frequency.

2. A system for demodulating and processing a modulated intermediate frequency signal containing coded, combined digital audio and digital data signals comprising:
   (1) a binary phase shift key demodulator for demodulating the intermediate frequency signal into a data stream;
   (2) a differential decoder for differentially decoding the data stream output by the demodulator;
   (3) a bit deinterleaver for deinterleaving bits contained in the data stream output by the differential decoder;
   (4) a forward error correction decoder for decoding the data stream output by the bit deinterleaver to identify transmission errors utilizing the convolutional self orthogonal code utilized in coding the signal;
   (5) a demultiplexer for dividing into separate data streams the single data stream output by the forward error correction decoder;
   (6) a digital expander for expanding the digitized audio signals output by the demultiplexer; and
   (7) a source decoder for converting the digitized analog audio portions of the signals output by the digital expander to analog form.

3. A system for transmission and reception of analog audio and digital data signals comprising:
   (a) a signal processing and modulation subsystem comprising:
      (1) a source encoder for converting the analog audio portions of said signals to digital form;
      (2) a digital compressor for compressing the digitized analog audio signals to reduce their data rates;
      (3) a multiplexer for combining into a single data stream the compressed signals output by the compressor;
      (4) a differential encoder for diferentially encoding the data stream output by the multiplexer;
      (5) a bit interleaver for interleaving the bits contained in the data stream output by the differential encoder;
      (6) a forward error correction encoder for encoding the data stream output by the bit interleaver utilizing a convolutional self orthogonal code; and
      (7) a binary phase shift key modulator for modulating the data stream output by the forward error correction encoder at an intermediate frequency;
   (b) a frequency conversion, amplification and transmission subsystem comprising:
      (1) an up-converter for converting the modulated intermediate frequency signal output by the modulator to an earth-to-satellite transmission frequency;
      (2) an amplifier for amplifying the signal output by the up-converter; and
      (3) an antenna for transmitting the amplified signal output by the up-converter;
   (c) a geosynchronous communication satellite with transponder for receiving the signal transmitted by the transmission antenna, converting it to a satellite-to-earth transmission frequency and transmitting it to earth;
   (d) a reception, amplification and frequency conversion subsystem comprising:
      (1) a receiving antenna for receiving the signal from the communication satellite;
      (2) a low noise amplifier for amplifying the received signal; and
      (3) a down-converter for converting the signal output by the low noise amplifier to the intermediate frequency; and
      (4) a forward error correction decoder for decoding the data stream output by the bit deinterleaver to identify transmission errors utilizing the convolutional self orthogonal code utilized in the forward error correction encoder;
      (5) a demultiplexer for dividing into separate data streams the single data stream output by the forward error correction decoder;
      (6) a digital expander for expanding the digitized audio signals output by the demultiplexer; and (7) a source decoder for converting the digitized analog audio portions of the signals output by the digital expander to analog form.

4. A system in accordance with claim 1 wherein said source encoder generates parallel, 15-bit, offset binary, digital words and said digital compressor compresses the 15-bit words to an 11-bit code with inverted, folded binary structure in accordance with the following code mapping:

| 15-Bit Linear Code | | | | | | | | | | | | | | | | 11-Bit Compressed Code | | | | | | | | | | | |
|---|---|---|---|---|---|---|---|---|---|---|---|---|---|---|---|---|---|---|---|---|---|---|---|---|---|---|---|
| Sign 1 | 2 | 3 | 4 | 5 | 6 | 7 | 8 | 9 | 10 | 11 | 12 | 13 | 14 | 15 | | | Sign 1 | 2 | 3 | 4 | 5 | 6 | 7 | 8 | 9 | 10 | 11 |
| 1 | 1 | a | b | c | d | e | f | g | x | x | x | x | x | x | Cord | 7 | 1 | 0 | 0 | 0 | $\bar{a}$ | $\bar{b}$ | $\bar{c}$ | $\bar{d}$ | $\bar{e}$ | $\bar{f}$ | $\bar{g}$ |
| 1 | 0 | 1 | a | b | c | d | e | f | g | x | x | x | x | x | | 6 | 1 | 0 | 0 | 1 | $\bar{a}$ | $\bar{b}$ | $\bar{c}$ | $\bar{d}$ | $\bar{e}$ | $\bar{f}$ | g |
| 1 | 0 | 0 | 1 | a | b | c | d | e | f | g | x | x | x | x | | 5 | 1 | 0 | 1 | 0 | $\bar{a}$ | $\bar{b}$ | $\bar{c}$ | $\bar{d}$ | $\bar{e}$ | f | g |
| 1 | 0 | 0 | 0 | 1 | a | b | c | d | e | f | g | x | x | x | | 4 | 1 | 0 | 1 | 1 | $\bar{a}$ | $\bar{b}$ | $\bar{c}$ | $\bar{d}$ | e | f | g |
| 1 | 0 | 0 | 0 | 0 | 1 | a | b | c | d | e | f | g | x | x | | 3 | 1 | 1 | 0 | 0 | $\bar{a}$ | $\bar{b}$ | $\bar{c}$ | d | e | f | g |
| 1 | 0 | 0 | 0 | 0 | 0 | 1 | a | b | c | d | e | f | g | x | | 2 | 1 | 1 | 0 | 1 | $\bar{a}$ | $\bar{b}$ | c | d | e | f | g |
| 1 | 0 | 0 | 0 | 0 | 0 | 0 | 1 | a | b | c | d | e | f | g | | 1 | 1 | 1 | 1 | 0 | $\bar{a}$ | b | c | d | e | f | g |
| 1 | 0 | 0 | 0 | 0 | 0 | 0 | 0 | a | b | c | d | e | f | g | | 0 | 1 | 1 | 1 | 1 | a | b | c | d | e | f | g |

5. A system in accordance with claim 3 wherein said source encoder generates parallel, 15-bit, offset binary, digital words and said digital compressor compresses the 15-bit words to an 11-bit code with inverted, folded binary structure in accordance with the following code mapping:

| 15-Bit Linear Code | | | | | | | | | | | | | | | | 11-Bit Compressed Code | | | | | | | | | | | |
|---|---|---|---|---|---|---|---|---|---|---|---|---|---|---|---|---|---|---|---|---|---|---|---|---|---|---|---|
| Sign 1 | 2 | 3 | 4 | 5 | 6 | 7 | 8 | 9 | 10 | 11 | 12 | 13 | 14 | 15 | | | Sign 1 | 2 | 3 | 4 | 5 | 6 | 7 | 8 | 9 | 10 | 11 |
| 1 | 1 | a | b | c | d | e | f | g | x | x | x | x | x | x | Cord | 7 | 1 | 0 | 0 | 0 | $\bar{a}$ | $\bar{b}$ | $\bar{c}$ | $\bar{d}$ | $\bar{e}$ | $\bar{f}$ | $\bar{g}$ |
| 1 | 0 | 1 | a | b | c | d | e | f | g | x | x | x | x | x | | 6 | 1 | 0 | 0 | 1 | $\bar{a}$ | $\bar{b}$ | $\bar{c}$ | $\bar{d}$ | $\bar{e}$ | $\bar{f}$ | g |
| 1 | 0 | 0 | 1 | a | b | c | d | e | f | g | x | x | x | x | | 5 | 1 | 0 | 1 | 0 | $\bar{a}$ | $\bar{b}$ | $\bar{c}$ | $\bar{d}$ | $\bar{e}$ | f | g |
| 1 | 0 | 0 | 0 | 1 | a | b | c | d | e | f | g | x | x | x | | 4 | 1 | 0 | 1 | 1 | $\bar{a}$ | $\bar{b}$ | $\bar{c}$ | $\bar{d}$ | e | f | g |
| 1 | 0 | 0 | 0 | 0 | 1 | a | b | c | d | e | f | g | x | x | | 3 | 1 | 1 | 0 | 0 | $\bar{a}$ | $\bar{b}$ | $\bar{c}$ | d | e | f | g |
| 1 | 0 | 0 | 0 | 0 | 0 | 1 | a | b | c | d | e | f | g | x | | 2 | 1 | 1 | 0 | 1 | $\bar{a}$ | $\bar{b}$ | c | d | e | f | g |
| 1 | 0 | 0 | 0 | 0 | 0 | 0 | 1 | a | b | c | d | e | f | g | | 1 | 1 | 1 | 1 | 0 | $\bar{a}$ | b | c | d | e | f | g |
| 1 | 0 | 0 | 0 | 0 | 0 | 0 | 0 | a | b | c | d | e | f | g | | 0 | 1 | 1 | 1 | 1 | a | b | c | d | e | f | g |

6. A system in accordance with claim 1 wherein the data rate output by said multiplexer is 7.68 megabits per second and the data rate output said forward error correction encoder is 8.777 megabits per second.

7. A system in accordance with claim 3 wherein the data rate output by said multiplexer is 7.68 megabits per second and the data rate output by said forward error correction encoder is 8.777 megabits per second.

8. A system in accordance with claim 2 wherein the data rate output by said demodulator is 8.777 megabits per second and the data rate output by said forward error correction decoder is 7.68 megabits per second.

9. A system in accordance with claim 1 wherein said forward error correction encoder utilizes a rate $\frac{7}{8}$, J=6, $d_{min}=7$ convolutional self orthogonal code with the following general polynominal code:

0, 3, 19, 52, 78, 146
0, 2, 8, 32, 88, 142
0, 11, 12, 62, 85, 131
0, 21, 25, 39, 82, 126
0, 5, 20, 47, 84, 144
0, 58, 96, 106, 113, 141
0, 41, 77, 108, 117, 130.

10. A system in accordance with claim 3 wherein said forward error correction encoder utilizes a rate $\frac{7}{8}$, J=6, $d_{min}=7$ convolutional self orthogonal code with the following general polynominal code:

0, 3, 19, 52, 78, 146
0, 2, 8, 32, 88, 142
0, 11, 12, 62, 85, 131
0, 21, 25, 39, 82, 126
0, 5, 20, 47, 84, 144
0, 58, 96, 106, 113, 141
0, 41, 77, 108, 117, 130.

11. A system in accordance with claim 2 wherein said forward error correction decoder utilizes a rate $\frac{7}{8}$, J=6, $d_{min}=7$ convolutional self orthogonal code with the following general polynomial code:

0, 3, 19, 52, 78, 146
0, 2, 8, 32, 88, 142
0, 11, 12, 62, 85, 131
0, 21, 25, 39, 82, 126
0, 5, 20, 47, 84, 144
0, 58, 96, 106, 113, 141
0, 41, 77, 108, 117, 130.

12. A system in accordance with claim 3 further comprising a scrambler following said multiplexer for scrambling the data stream output by the multiplexer and a descrambler preceeding said demultiplexer for descrambling the data stream input to the demultiplexer.

13. A system in accordance with claim 1 further comprising a scrambler following the multiplexer for scrambling the data stream output by the multiplexer.

14. A system in accordance with claim 2 further comprising a descrambler preceeding the demultiplexer for descrambling the data stream input to the demultiplexer.

15. An improved method for transmission and reception of analog audio signals comprising the steps of:
(a) converting said analog audio signals to digital form;
(b) compressing the digital signals to reduce their data rates;
(c) combining the compressed signals into a single data stream;
(d) scrambling the data stream;

(e) forward error correction encoding the scrambled data stream utilizing a convolutional self orthogonal code;

(f) interleaving the bits contained in the forward error correction encoded data stream;

(g) differentially encoding the bit interleaved data stream;

(h) binary phase shift key modulating an intermediate frequency carrier with the differentially encoded data stream;

(i) converting the modulated intermediate frequency signal to an earth-to-satellite transmission frequency;

(j) amplifying the transmission frequency signal;

(k) transmitting the amplified signal to a geosynchronous communication satellite with transponder;

(l) converting the signal received by the satellite to a satellite-to-earth transmission frequency and transmitting it to earth;

(m) receiving the signal transmitted from the satellite and amplifying it;

(n) converting the amplified received signal to the intermediate frequency;

(o) demodulating the received intermediate frequency signal into a received data stream;

(p) differentially decoding the received data stream;

(q) bit deinterleaving the differentially decoded data stream;

(r) forward error correction decoding the bit deinterleaved data stream utilizing the convolutional self orthogonal code utilized in encoding utilized in the forward error correction encoding step;

(s) descrambling the forward error correction decoded data stream;

(t) demultiplexing the descrambled data stream into separate data streams;

(u) digitally expanding the demultiplexed data streams; and (v) converting the expanded digital data streams into analog audio signals.

* * * * *

Disclaimer and Dedication

4,567,591—James S. Gray, Dunwoody, Ga.; James W. Chamberlin, Alan L. McBride, both of Lawrenceville, Ga.; Peter G. Schreiner, III, Clarkston, Ga. DIGITAL AUDIO SATELLITE TRANSMISSION SYSTEM. Patent dated Jan. 28, 1986. Disclaimer and Dedication filed June 18, 1996, by the assignee, Scientific-Atlanta, Inc.

Hereby disclaims and dediactes to the public the remaining term of said patent.
*(Official Gazette,* August 26, 1997)